United States Patent
Eitrheim et al.

[11] Patent Number: 5,878,269
[45] Date of Patent: Mar. 2, 1999

[54] HIGH SPEED PROCESSOR FOR OPERATION AT REDUCED OPERATING VOLTAGE

[75] Inventors: John K. Eitrheim; Richard B. Reis, both of Garland; Steve McMahan; Lawrence H. Hudepohl, both of Richardson; Douglas Ewing Duschatko, Plano; Tai Dinh Ngo, Arlington; Jeffrey Byrne, Garland, all of Tex.

[73] Assignee: National Semiconductor Corporation, Santa Clara, Calif.

[21] Appl. No.: 859,347

[22] Filed: Mar. 27, 1992

[51] Int. Cl.⁶ .................................................. G06F 9/00
[52] U.S. Cl. .................. 395/800.42; 395/750.3; 327/56
[58] Field of Search .................. 395/800, 725, 395/750, 800.42, 750.03; 307/451, 651; 365/208, 207, 97, 156, 210; 327/55, 57, 56

[56] References Cited

U.S. PATENT DOCUMENTS

| | | | |
|---|---|---|---|
| 3,656,003 | 4/1972 | Chen et al. | 307/238 |
| 3,671,772 | 6/1972 | Henle | 307/292 |
| 4,458,313 | 7/1984 | Suzuki et al. | 364/200 |
| 4,514,805 | 4/1985 | McDonough et al. | 395/725 |
| 4,527,234 | 7/1985 | Bellay | 395/500 |
| 4,532,587 | 7/1985 | Roskell et al. | 395/800 |
| 4,539,658 | 9/1985 | Shimohigashi et al. | 365/207 |
| 4,809,231 | 2/1989 | Shannon et al. | 365/201 |
| 4,972,202 | 11/1990 | Reis et al. | 307/451 |
| 4,984,202 | 1/1991 | Kawahara | 365/177 |
| 5,034,636 | 7/1991 | Reis et al. | 307/530 |
| 5,045,723 | 9/1991 | Mao | 307/451 |
| 5,079,745 | 1/1992 | Ito et al. | 365/207 |
| 5,083,295 | 1/1992 | Lammerts et al. | 365/205 |
| 5,126,974 | 6/1992 | Sasaki et al. | 365/207 |
| 5,172,340 | 12/1992 | Leforestier et al. | 365/207 |
| 5,189,322 | 2/1993 | Chan et al. | 307/530 |
| 5,237,533 | 8/1993 | Papaliolios | 365/207 |
| 5,280,449 | 1/1994 | Oldham | 365/189.02 |

*Primary Examiner*—Larry D. Donaghue
*Attorney, Agent, or Firm*—John L. Maxin

[57] ABSTRACT

A microprocessor is implemented using sense amplifiers to replace CMOS logic circuits, in order to provide low voltage, high frequency switching. The input node of the sense amplifier is maintained at a voltage just above or just below their trip-point of one inverter in order to obtain high-speed switching. Bench mark tests have shown that a microprocessor operating at 2.7 volts may obtain a frequency of 20 MHz and while the same microprocessor may operate at 5.5 volts and 40 MHz.

11 Claims, 8 Drawing Sheets

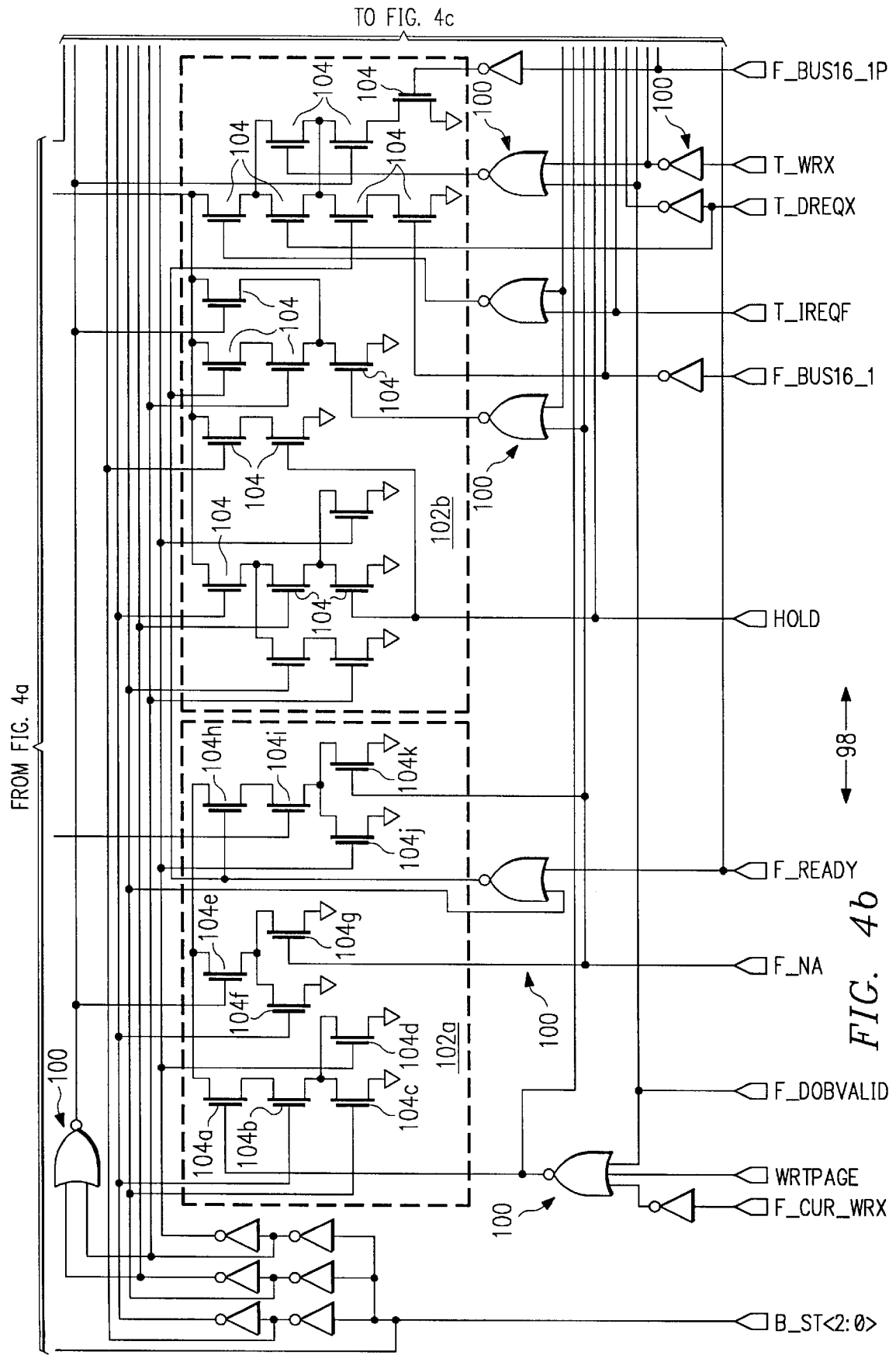

HIGH SPEED PROCESSOR FOR OPERATION AT REDUCED OPERATING VOLTAGE

TECHNICAL FIELD OF THE INVENTION

This invention relates in general to integrated circuits, and more particularly to a low voltage, high frequency electronic processing device.

BACKGROUND OF THE INVENTION

A current trend in the electronics industry is a move towards lower voltage electronic devices. Over the last two decades, most TTL and CMOS devices have been designed with a five-volt operation voltage. Presently, electronic devices having a 3.3 volt operating voltage are becoming increasingly available.

Two forces have been behind moving towards the 3.3 volt devices. One force is the need for lower power devices to extend the time which an electronic circuit may be powered by a battery source. A second force has been the increasingly smaller device sizes of integrated circuits needed for higher circuit densities. Importantly, in order to increase the density of random access memories, 0.8 micron device sizes have been used, with smaller device sizes on the horizon. Smaller device technologies use a thinner gate oxide for the MOS transistors which, in turn, reduces the breakdown voltages of the device. Hence, in high density circuits, not only is a low voltage desirable, but is required for reliable operation of the devices.

One major problem in the move toward low voltage devices has been the operating frequency of the devices. As a general rule, the low-voltage devices cannot match the operating frequency of higher voltage devices. The tradeoff between operating voltage and operating frequency is particularly critical for processing devices, such as a microprocessors and microcontrollers.

Despite the advantages of low voltage devices, the market will continue to require the more standard higher voltage devices as well. Hence, it is desirable to use a design which will operate over a range of voltages rather than design two parts using different technologies, one part for low voltage operation and one part for five volt operation. For example, for a microprocessor, it would be desirable to design a part which operated from three volts to 5.5 volts, while exceeding a desired operating frequency, such as 20 MHz, at the low voltage. Consequently, the low voltage operation of the device cannot be satisfied solely by using smaller technologies, since the smaller technologies will inhibit operation at higher voltages, such as five volts.

Therefore, a need has arisen for a low-voltage, high frequency processing device which can operate reliably within a range of voltages.

SUMMARY OF THE INVENTION

In accordance with the present invention, a processing device is disclosed which provides enhanced performance over a wide voltage range.

The processing device of the present invention may operate over a wide voltage range while maintaining a high frequency. The preferred embodiment of the present invention operates from 2.7 volts to 5.5 volts (3.0–5.0 volts nominal +/−10%) with a corresponding frequency range of 20 MHz to 40 MHz.

To achieve low voltage and high frequency, use is made of low voltage sense amplifiers which allow fast switching responsive to a small change in input voltage. The sense amplifiers allow the circuit designer to avoid long strings of series P-channel devices which greatly reduce the system's speed.

The present invention provides a technical advantage over the prior art, not only by providing high frequency and low voltage, but also by providing a complex electronic circuit which may operate over a large voltage range.

BRIEF DESCRIPTION OF THE DRAWINGS

For a more complete understanding of the present invention, and the advantages thereof, reference is now made to the following descriptions taken in conjunction with the accompanying drawings, in which:

FIG. 3b illustrates a prior art CMOS implementation of NOR gate of FIG. 3a;

FIGS. 4a–c illustrate a schematic of a bus interface using the sense amplifier of FIG. 2;

DETAILED DESCRIPTION OF THE INVENTION

The preferred embodiment of the present invention and its advantages are best understood by referring to FIGS. 1–8 of the drawings, like numerals being used for like and corresponding parts of the various drawings.

Figure 1:
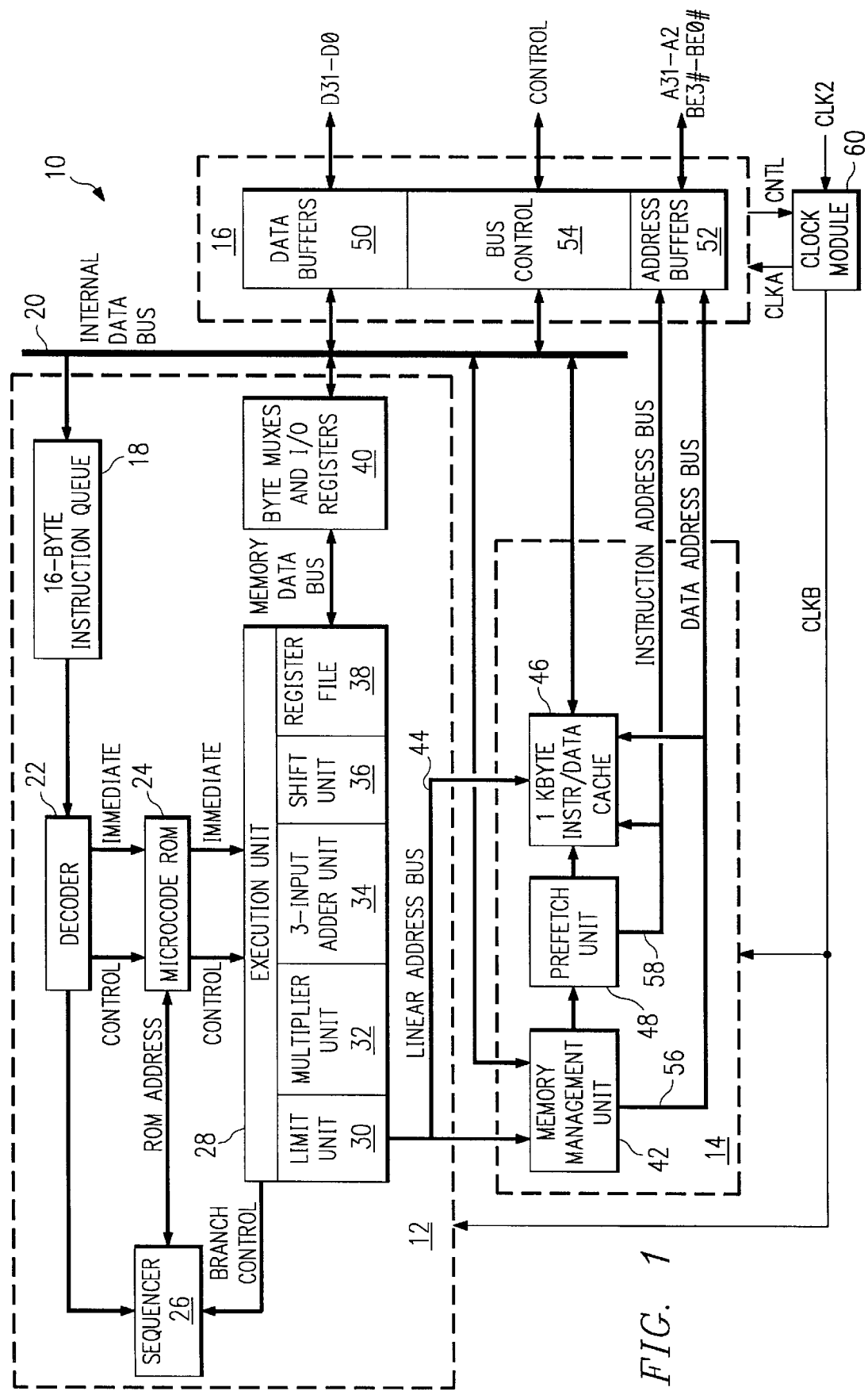
FIG. 1 illustrates a block diagram of a microprocessors

FIG. 1 illustrates a detailed block diagram of the various subcircuits of a preferred embodiment of a microprocessor 10. While the present invention is described in connection with a microprocessor, it may also be used for other processing devices, such as microcontrollers. For purposes of illustration, the microprocessor 10 will be described in connection with a microprocessor which is pin-compatible and instruction-compatible with the 80×86 family of processors by Intel Corporation, specifically the 80386 microprocessor.

The microprocessor 10 comprises three main functional groups: the core circuitry 12, the memory circuitry 14 and the bus controller 16. The core circuitry 12 includes an instruction queue 18 coupled to an internal data bus 20. The output of the instruction queue 18 is coupled to a decoder 22. The decoder 22 is coupled to a microcode RON 24 and a sequencer 26. The sequencer 26 is also coupled to the microcode ROM 24 and to an execution unit 28. The execution unit 28 includes a limit unit 30, a multiplier unit 32, an adder unit 34, a shift unit 36, and a register file 38. The execution unit 28 is coupled to the microcode RON 24 and to multiplexer and I/O register circuitry 40.

The memory circuitry 14 comprises a memory management unit 42 coupled to a linear address bus 44 which is also connected to the execution unit 28 and an instruction/data cache memory 46. Memory management unit 42 is further coupled to the internal data bus 20. A prefetch unit 48 is coupled between the memory management unit 42 and the cache 46. Bus controller 16 includes data buffers 50, address buffers 52 and control circuitry 54. The data buffers 50 are coupled to the data I/O pins D31-DO, the address buffers 52 are coupled to the address pins A31-A2 and BE3#-BE0#. A data address bus 56 is coupled to the memory management unit 42, the cache 46 and the address buffer 52. An instruction address bus 58 is coupled to the prefetch unit 48, cache 46 and address buffer 52. The data buffers 50 are coupled to the internal data bus 20.

Clock module 60 receives an external clock signal (CLK2) and generates CLKA (connected to the bus controller 16) and CLKB (coupled to the memory circuitry 14 and the core circuitry 12). CLKA and CLKB are both clock signals of one-half the frequency of CLK2. Clock module 60 receives control signals from bus controller 16.

In operation, instructions are received by the microprocessor 10 from external memory under control of the memory management unit 42. For enhanced performance, an instruction/data cache 46 caches instruction and data received through the bus controller 16. Instructions are stored in the instruction queue and are subsequently translated by the decode circuitry 22 into microcode. The sequencer points to the next address in the microcode ROM 24 under control of the decoder 22 and the execution unit 28. The execution unit 28 processes information under control of the microcode ROM 24.

In the preferred embodiment, the microprocessor 10 has a static design, i.e., retention of data in the internal memories and registers of the microprocessor 10 is not dependent upon the clock signal. In the preferred embodiment, the clock module 60, under control of the bus controller 16, can disable clocks to the subcircuits of the core circuitry 12 and the memory circuitry 14 while continuing to generate clock signals to the bus controller 16. Thus, during periods of inactivity, a large portion of the circuitry of the microprocessor may be suspended, thereby greatly reducing the power consumed by the microprocessor 10. This aspect of the microprocessor 10 is described in greater detail in connection with U.S. patent application Ser. No. 07/858, 579, entitled "Microprocessor with Hardware Controlled Power Management" to Herubin et al., filed on Mar. 27, 1992, which is incorporated by reference herein.

Figure 2:
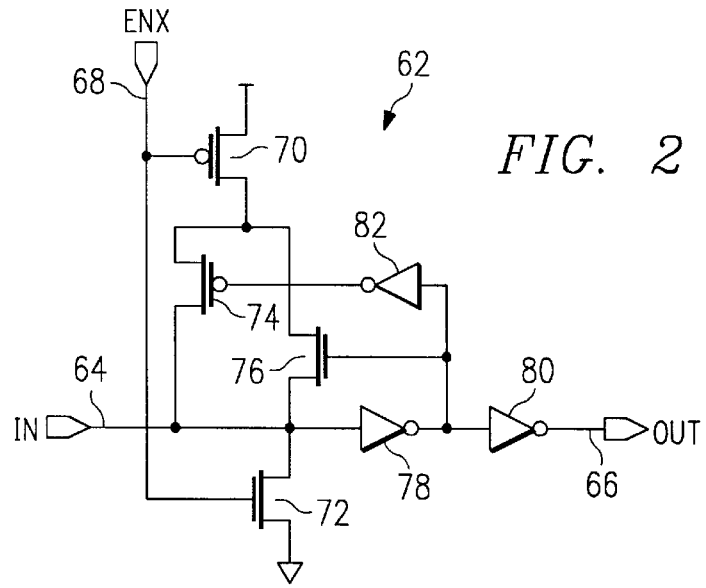
FIG. 2 illustrates a schematic representation of a sense amplifier.

FIG. 2 illustrates a schematic representation of a sense amplifier 62. The sense amplifier has an input node (IN) 64, an output node (OUT) 66 and an enable node (ENX) 68. The enable node 68 is coupled to the gates of P-channel transistor 70 and N-channel transistor 72. P-channel 70 has a first source/drain coupled to $V_{dd}$ (which may vary depending upon the supplied operating voltage of the microprocessor 10), a second source/drain coupled to a first source/drain of P-channel transistor 74 and a first source/drain of N-channel transistor 76. The second source/drains of P-channel transistor 74 and N-channel transistor 76 are coupled to IN node 64. A first source/drain of N-channel transistor 72 is coupled to IN node 64 and the second source/drain of N-channel transistor 72 is coupled to ground. IN node 64 is also coupled to the input of inverter 78. The output of inverter 78 is coupled to the inputs of inverters 80 and 82 and to the gate of N-channel transistor 76. The output of inverter 80 is coupled to OUT 66. The output of inverter 82 is coupled to the gate of P-channel transistor 74.

In operation, the sense amplifier 62 works as follows. ENX 68 allows the sense amplifier 62 to be selectively enabled or disabled. To disable the sense amplifier 62, the ENX 68 is pulled high, thereby turning off P-channel transistor 70 and turning on N-channel transistor 72. Since the only path to $V_{dd}$ is through P-channel transistor 70, IN node 64 will be pulled low.

With ENX 68 low, the sense amplifier 62 is enabled. If IN node 64 is pulled down to a voltage which trips inverter 78 (thereby producing a logical high voltage on the output of inverter 78), inverter 82 is also tripped (thereby producing a logical low at its output). Thus, P-channel transistor 74 is turned on, producing a path to $V_{dd}$ through the P-channel load transistors 70 and 74. With P-channel transistors 70 and 74 turned on, the input node is pulled upward such that it is slightly below the trip-point of inverter 78.

When IN node 64 is floating, the P-channel transistors 70 and 74 pull up the voltage on IN node 64 until inverter 78 switches to a point that inverter 82 turns off P-channel transistor 74. Thus, IN node 64 will float just above the trip-point of inverter 78. If charge leaks from IN node 64, pulling the voltage below the trip-point of inverter 78, inverter 82 is designed to have a trip-point which is lower than the trip-point of inverter 80 to prevent inadvertent switching at the OUT node 66. Therefore, inverter 82 will switch prior to inverter 80, thereby turning on transistor 74 and pulling IN node 64 back to a voltage slightly above the trip-point of inverter 78.

N-channel transistor 76 has two purposes. After inverter 78 switches, N-channel transistor turns on. Since N-channel transistor is a relatively strong device (approximately four times stronger than P-channel transistor 74), it keeps IN node 64 from being pulled lower. Further, if the sense amplifier 62 is disabled and IN node 64 is pulled to ground, then N-channel transistor 76 quickly restores the IN node 64 node to a proper voltage level when the sense amplifier is re-enabled.

Consequently, IN node 64 switches only slightly above and slightly below the trip-point of inverter 78. Thus, only a small change is needed on the IN node 64 of the sense amplifier 62 to change the logic state at its output node 66. The trip-point of inverter 78 is approximately one volt for a 3-volt supply voltage in the preferred embodiment; however, it can be adjusted to any desirable voltage. The trip-point of the inverters will scale appropriately with changes in the voltage supplied to the microprocessor 10.

Figure 3A:
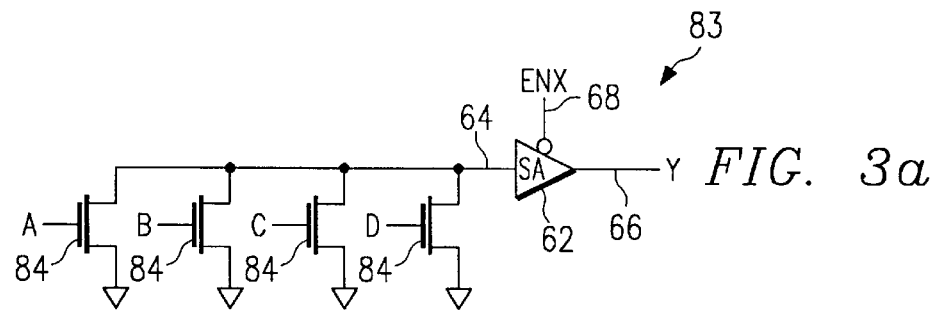
FIG. 3a illustrates a NOR gate implemented with the sense amplifier of FIG. 2.
Figure 3B:
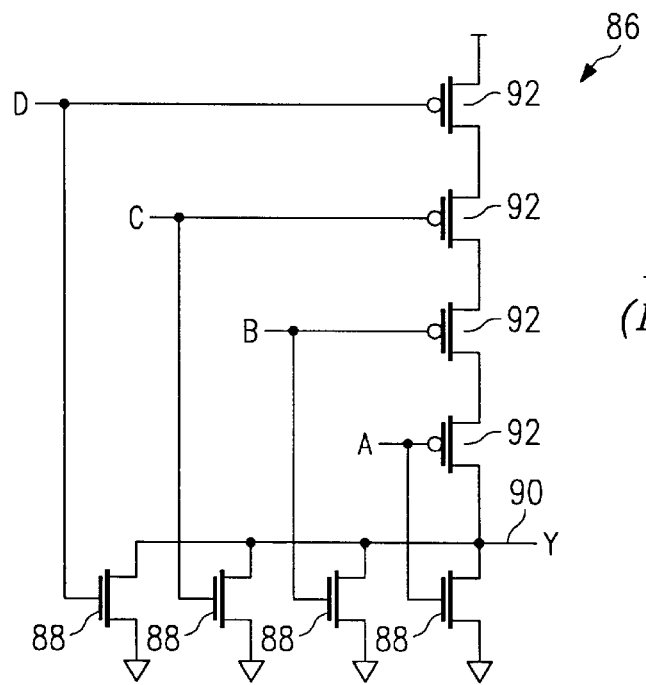

The advantages of using the sense amplifier 62 are best understood by referring to FIGS. 3a and 3b which respectively illustrate a NOR gate 83 implemented using the sense amplifier 62 with the same NOR gate implemented in CMOS. In FIG. 3a, the IN node 64 is coupled to first source/drains of a plurality of N-channel transistors 84. The respective second source/drains of the N-channel transistors 84 are coupled to ground. The gates of the N-channel transistors are coupled to respective logic control signals "a", "b", "c" and "d".

In practice, the IN node 64 may be coupled to many more N-channel transistors; it is not uncommon for 50–100 N-channel transistors to be coupled to the IN node 64 of a single sense amplifier 62.

In operation, the output 66 of the sense amplifier 62 is at a logical high while all N-channel transistors 84 are turned off. If the logic control signal to one or more of the gates of the transistors 84 is pulled high, thereby producing a path between IN node 64 and ground, then the OUT node 66 sense amplifier 62 will switch low; however, as described in connection with FIG. 2, IN node 64 will be held at a voltage just slightly below the trip-point of inverter 78. Thus, when the NOR gate returns to a state where all transistors 84 are turned off, the IN node 64 will be pulled just above the switch point of inverter 78, thereby generating a logical high output.

A NOR gate 86 implemented in CMOS with a comparable function is shown in FIG. 3b. The NOR gate 86 comprises a plurality of N-channel devices 88, each having a first source/drain coupled to node 90 and a second source/drain coupled to ground. Respective P-channel transistors 92 are coupled with their source/drains in series, the first P-channel transistor 92 in the series having a source/drain coupled to $V_{dd}$ and the last P-channel transistor 92 in the series having a source/drain coupled to node 90. Respective logic control signals are coupled to the gates of corresponding N and P-channel transistors.

In operation, if any of the logic control signals is a logical high voltage, then the path through the P-channel transistors 92 will be disabled and a path to ground will be formed through one of the N-channel transistors 88, thereby pulling node 90 low. On the other hand, if all logic control signals "a"–"d" are at a logical low, then all N-channel devices 88 will be turned off and all P-channel devices 92 will be turned on, thereby creating a path between $V_{dd}$ and node 90. However, the switching of node 90 between logical high and logical low voltages will be slow, mainly because of the series of P-channel transistors. The slowness of node 90 due to the in-series P-channel transistors 92 will increase as the number of inputs to the NOR device increases.

It should be noted that while the sense amplifier 62 of FIG. 2 has two P-channel transistors 70 and 74 in series, P-channel transistor 70 is always turned on while the sense amplifier is enabled and P-channel transistor 74 need only pull up the voltage on IN node 64 slightly to switch to the inverter 78.

Figure 4A:
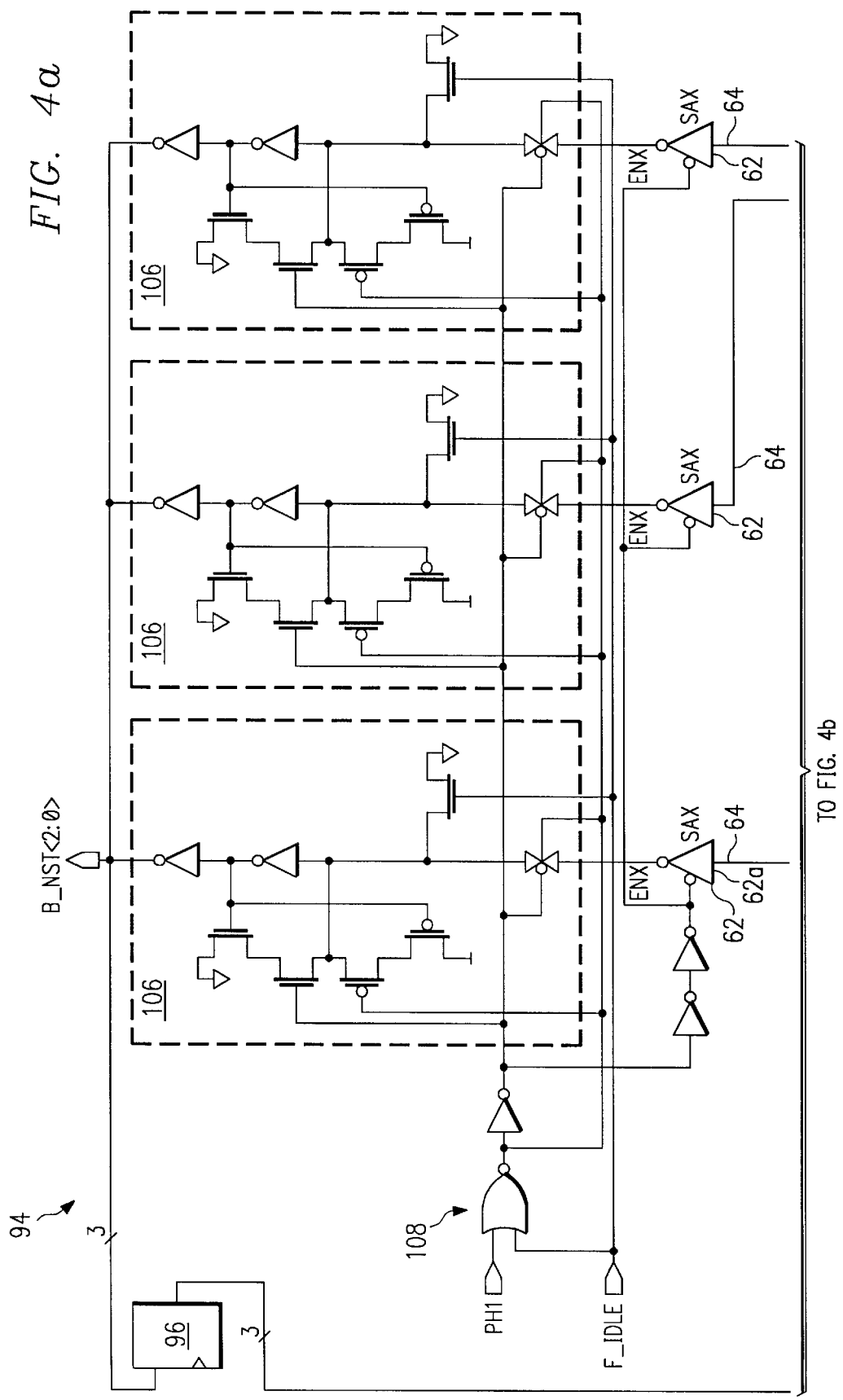
Figure 4C:
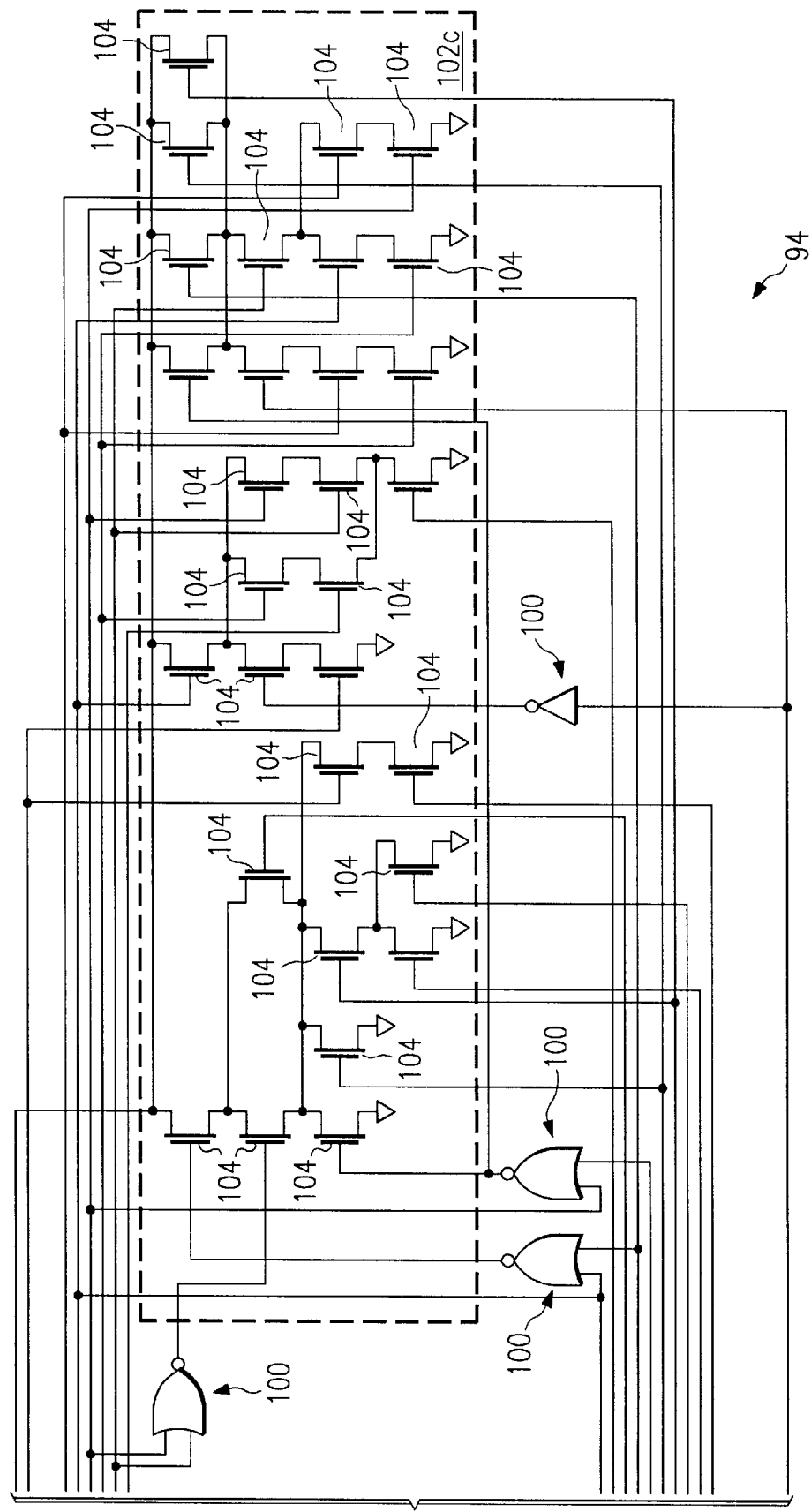

FIGS. 4a–c illustrate an example of use of the sense amplifier 62 to implement complex logic. FIGS. 4a–c illustrate a state machine 94 used in the bus controller 16. The state machine 94 takes a 3-bit number stored in latch 96 and derives the next state based on a plurality of control signals 98 and the previous 3-bit number. The control signals 98 and the 3-bit number are manipulated using logic gates 100, such as inverters and two- and three-input NOR gates. The output of logic gates 100 is coupled to a plurality of transistor groups 102a–c which implement the logic to derive the next state based on the output of the logic gates 100. Each transistor group 102a–c comprises a plurality of transistors 104 which may be coupled in series or in parallel to the IN node 64 of a respective sense amplifier 62. In the embodiment shown in FIG. 4, the sense amplifier 62 are labeled "SAX" to denote that the output inverter 80 is not used and the final inversion is performed in output latches 106, which is controlled by clock circuitry 108.

To illustrate the operation of the circuit, transistors 104 of transistor group 102a have been labelled 104a–k. The sense amplifier corresponding to transistor group 102a is labeled 62a. To form a path to ground through transistors 104a–d, the gates of transistors 104a and 104b must both be driven high and one of transistors 104c and 104d must be driven high. Hence, to form a path to ground, the logic function ab(c+d) is implemented. Similarly, transistors 104e–g implement the function e(f+g). Transistors 104h–k implement the function hi(j+k). Hence, if any of the aforementioned logic functions is true, based on the respective inputs to the transistors 104a–k, the IN node 64 of sense amplifier 62a will be pulled low. Thus, as can be shown from FIG. 4, a very complex logic operation may be implemented with relatively few N-channel transistors coupled in series and in parallel and a resulting path to ground may be detected using sense amplifier 62.

Figure 5:
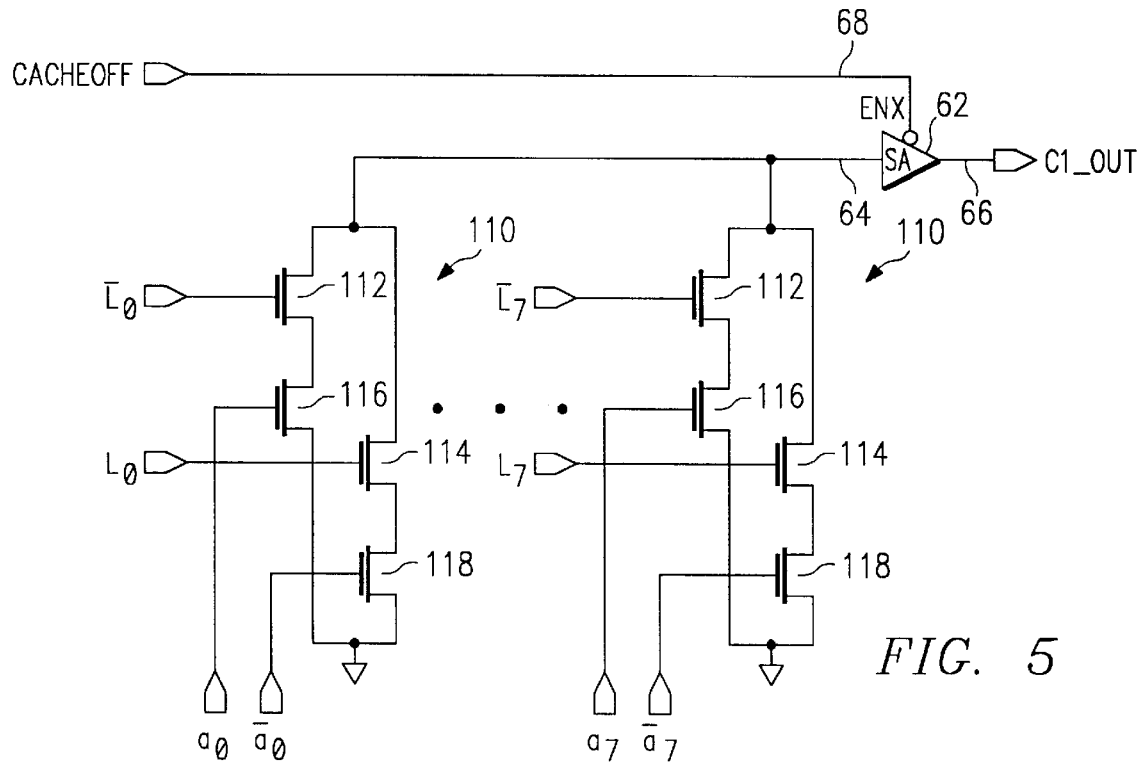
FIG. 5 illustrates a schematic representation of an address comparator using the sense amplifier of FIG. 2.

FIG. 5 illustrates a schematic representation of an address comparator using the sense amplifier of FIG. 2. The IN node 64 of the sense amplifier 62 is coupled to a plurality of bit compare circuits 110, each bit compare circuit 110 comparing respective bits of a line address L (comprising bits $L_0$–$L_7$) and address "a" (comprising address bits $a_0$–$a_7$). The complement of the line address bits $\overline{L_0}$–$\overline{L_7}$ are connected to the gates of respective N-channel transistors 112 which have a first source/drain coupled to the IN node 64 of the sense amplifier 62. Each bit of the line address is coupled to the gates of respective N-channel transistors 114 having a first source/drain coupled to the IN node 64 of the sense amplifier 62. The address bits $a_0$–$a_7$ are coupled to the gates of N-channel transistors 116 having a first source/drain coupled to the second source/drain of N-channel transistor 112 and having a second source/drain coupled to ground. Similarly, the complements of the address bits ($\overline{a_0}$–$\overline{a_7}$) are coupled to gates of N-channel transistors 118 having a first source/drain coupled to the second source/drains of N-channel transistors 114 and having a second source/drain coupled to ground. The enable node 68 of the sense amplifier 62 is connected to a control signal CACHEOFF which disables the comparator.

In operation, each address bit drives the gate of a transistor which is in series with a transistor driven by the complement of the respective bit of the other address. Thus, $\overline{L_0}$ and $a_0$ drive respective transistors 112 and 116 which are in series between the IN node and ground and $L_0$ and $\overline{a_0}$ drive respective transistors 114 and 118 which are in series between the IN node 64 and ground. If any two corresponding bits between the line address and address "a" are different (and thus the addresses are not equal) then either transistors 112 and 116 will be both enabled or transistors 114 and 118 will be both enabled. If both transistors of a pair are enabled, the IN node of 64 of sense amplifier 62 will be pulled low, as will the OUT node 66. If all corresponding bits are the same, there will be no path to ground and the out node 66 will remain at a logical high.

Figure 6:
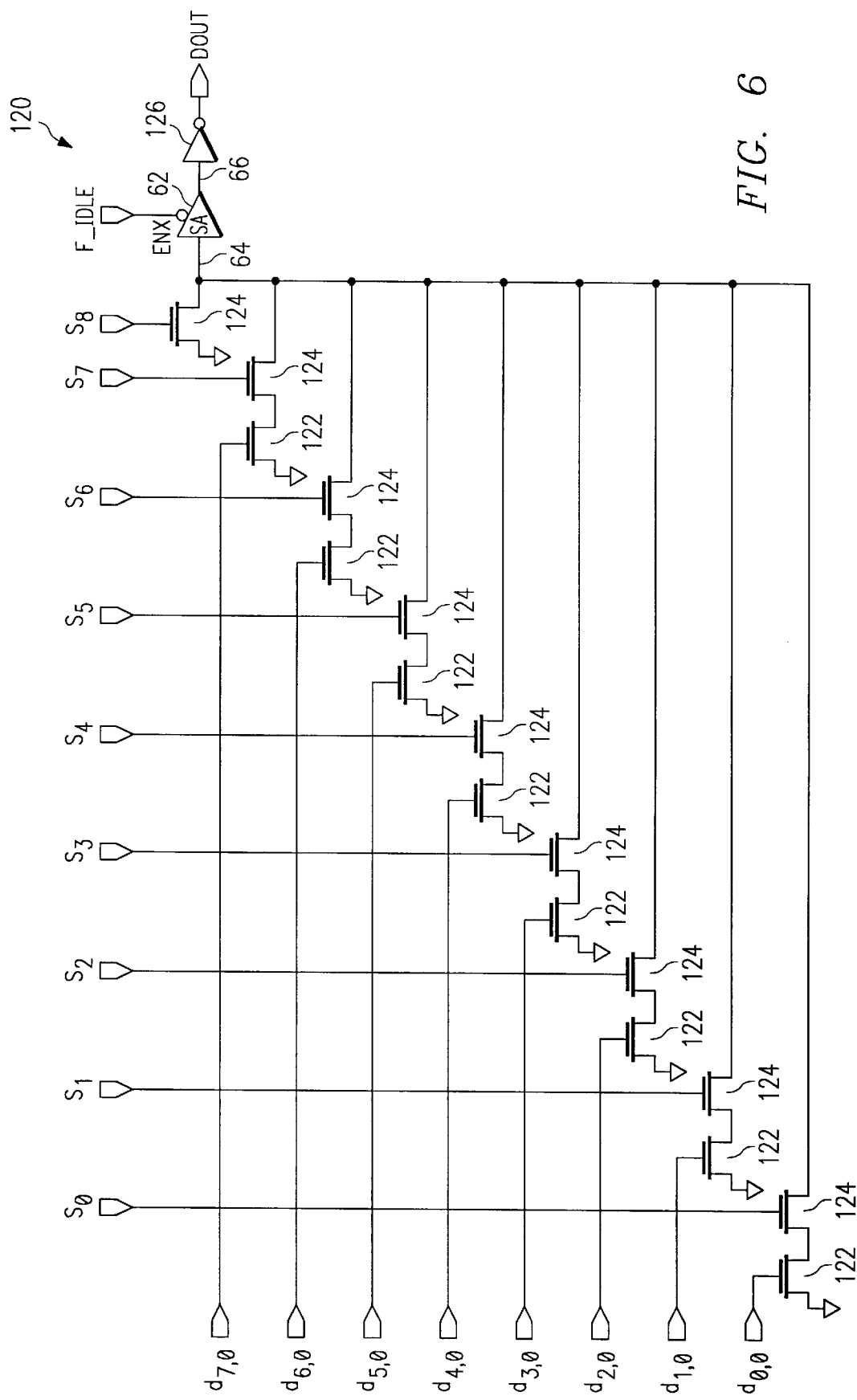
FIG. 6 illustrates a schematic representation of a microcode address multiplexer using the sense amplifier of FIG. 2.

FIG. 6 illustrates a schematic representation of one plane of a multiplexing circuit 120 used in the sequencer 26 of the microprocessor 10. The number of planes in the multiplexer 26 would depend upon the width of the data words being passed therethrough. For example, for a multiplexer for passing eight 8-bit words, eight planes 120 as shown in FIG. 6 would be necessary. The data bits for the LSBs of data words $d_0$–$d_7$ are shown in FIG. 6. The SELECT signals $s_0$–$s_8$ select which data word's bits are passed to the output (DOUT). SELECT signals $s_8$ always passes a logical "1" to the output. Each of the inputs to the multiplexer plane 120 are coupled to the gate of a respective N-channel transistor 122. The select nodes $S_0$–$S_8$ are connected to the gates of respective N-channel transistors 124 which have source/drains in series with corresponding transistors 122. The series N-channel transistors are coupled to the IN node 64 of the sense amplifier 62. The OUT node 66 of the sense amplifier 62 is coupled to inverter 126.

In operation, only one of the select nodes $s_0$–$s_8$ will be driven high. That node creates a low resistance path through its corresponding N-channel transistor 124. If the data bit coupled to the associated transistor 122 is also high, a path to ground with the IN node 64 will be formed. Hence, the OUT node 66 of the sense amplifier 62 will be pulled to a logical low and the output of inverter 126 will be a logical high. If, on the other hand, the data bit corresponding to the transistor 122 associated with the selected node is low, there will be no path to ground formed, and the output of inverter 126 will remain low. FIG. 6 is a good example of how a complex circuit may be formed using a relatively low number of transistors coupled to a single sense amplifier 62.

Figure 7:
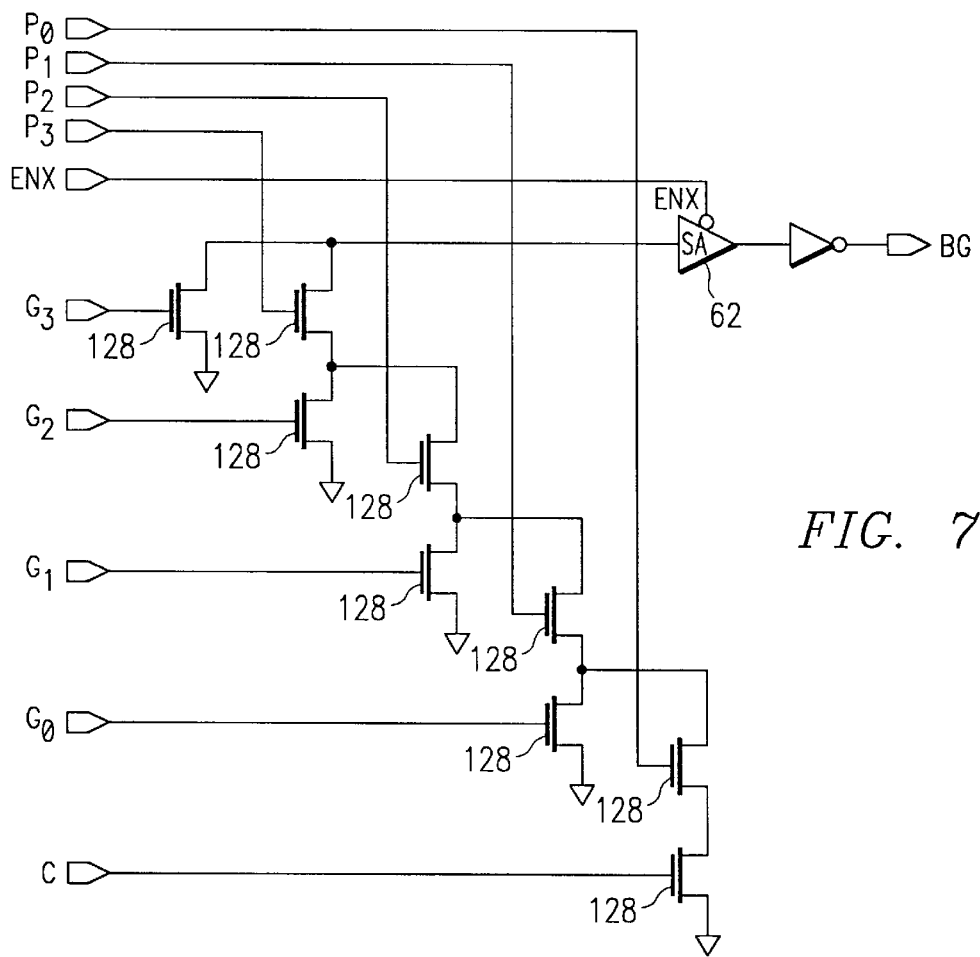
FIG. 7 illustrates a schematic representation of a carry look-ahead generation circuit using the sense amplifier of FIG. 2.

FIG. 7 illustrates a schematic representation of a carry look-ahead generation circuit. Signals $P_0$–$P_3$ are high when a corresponding stage of an adder is able to propagate a carry. Inputs $G_0$–$G_3$ are high when a respective stage of the adder has generated a carry. The circuit of FIG. 7 implements a function:

$$G_3+P_3G_2+P_2P_3G_1+P_1P_2P_3G_0+P_0P_1P_2P_3C$$

where C is the carry into the adder. A sense amplifier 62 is coupled to a plurality of transistors 128 arranged to implement the function. As can be seen, the number of devices used to implement the function are much less than would be required using other technologies, such as CMOS.

Figure 8:
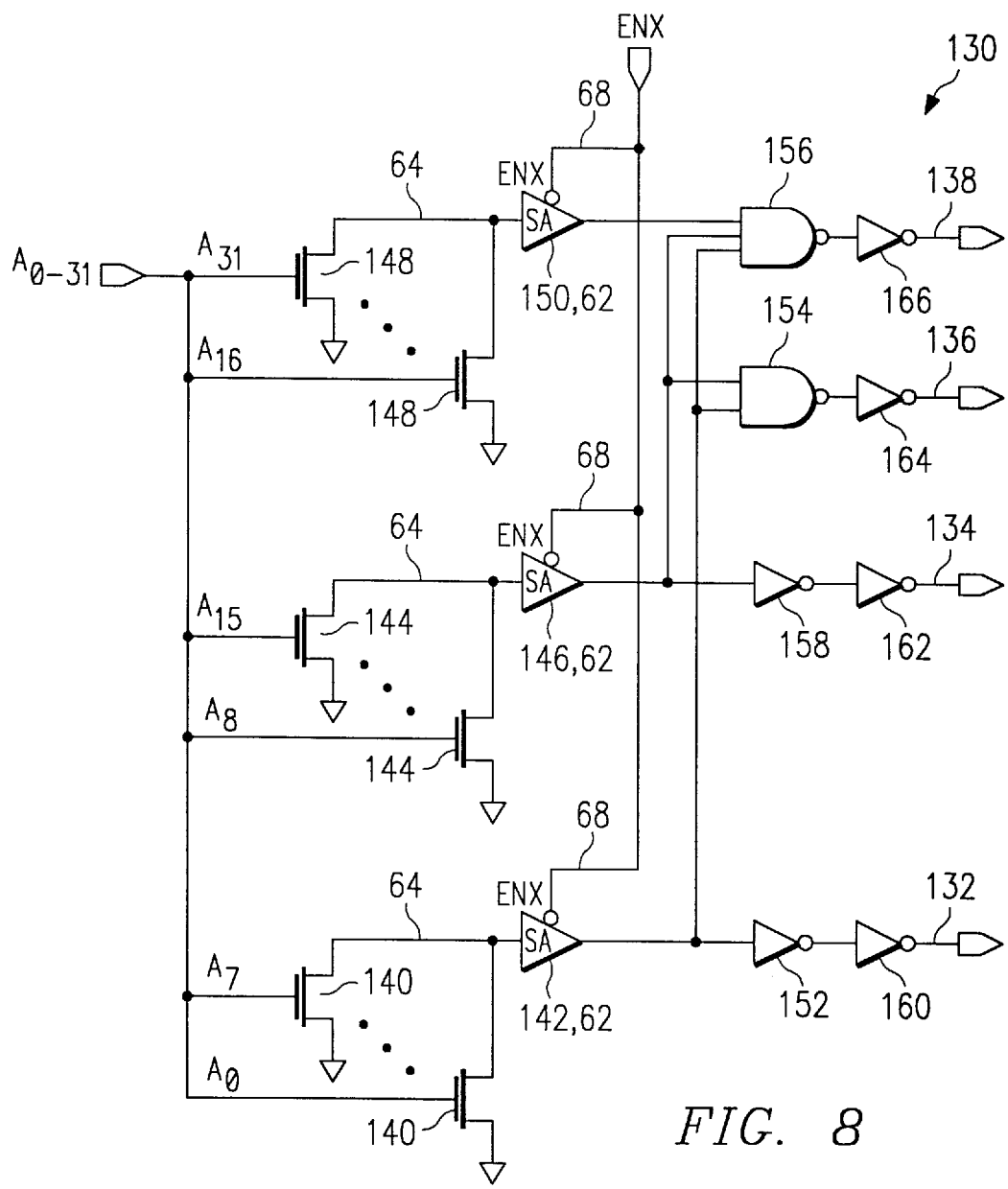
FIG. 8 illustrates a zero-detect circuit using the sense amplifier of FIG. 2.

FIG. 8 illustrates a zero detect circuit which receives the output of a 32-bit adder and determines whether the output equals "0". The zero detect circuit 130 provides four outputs: (1) a first output 132 which indicates whether the low order 8-bit ($A_0$–$A_7$) are set to "0", (2) an output 134 indicating whether bits $A_8$–$A_{15}$ are set to "0", (3) an output 136 which indicates whether the low order 16-bits ($A_0$–$A_{15}$) are set to "0" and an output 138 which indicates whether the entire 32-bits are set to "0". Adder bits $A_0$–$A_7$ are coupled to the gates of respective transistors 140 whose source/drains are coupled in parallel between the IN node 64 of a sense amplifier 142 and ground. Bits $A_8$–$A_{15}$ are coupled to gates of respective transistors 144 which have source/drains coupled between the IN node 64 of a sense amplifier 146 and ground. Adder bits $A_{16}$–$A_{31}$ are coupled to gates of respective transistors 148 which are coupled between the IN node 64 of sense amplifier 150 and ground.

The enable nodes 68 of the sense amplifiers 142, 146 and 150 are coupled to a common control signal "ENX". The output of sense amplifier 142 is coupled to the input of inverter 152, a first input of NAND gate 154 and a first input of NAND gate 156. The output of sense amplifier 146 is coupled to the input of inverter 158, the second input to NAND gate 154 and the second input to the NAND gate 156. The output of sense amplifier 150 is coupled to the third input of NAND gate 156. The output of inverter 152 is coupled to the input of inverter 160; the output of inverter 160 comprises output 132 of the zero detect circuit 130. The output of inverter 158 is coupled to the input of inverter 162; the output of inverter 162 comprises the output 134 of the zero detect circuit 130. The output of NAND gate 154 is coupled to the input of inverter 164; the output of inverter 164 is the output 136 of the zero detect circuit 130. The output of NAND gate 156 is coupled to the input of inverter 166; the output of inverter 166 is the output 138 of the zero detect circuit 130.

In operation, the respective groups of parallel connected transistors 140, 144 and 148 form NOR gates with the adder bits to which they are connected. Hence, if any of the adder bits $A_0$–$A_7$ are set to "1", then a path will be formed between the IN node of sense amplifier 142 and ground, thereby causing a "0" output from sense amplifier 142. Consequently, the output 132 will be set to "0". On the other hand, if all the bits $A_0$–$A_7$ are set to "0", there will be no path between the input of sense amplifier 142 and ground, and accordingly, the output 132 will be set to "1". Similarly, transistors 144 will create a path to ground if one of the respective adder bits $a_8$–$a_{15}$ is set to "1". Consequently, the output 134 will be set to "1" only if all adder bits $A_8$–$A_{15}$ are set to "0". NAND gate 154 logically combines the output of sense amplifier 142 and 146 to determine whether the low order 16-bits of the adder are set to "0". NAND gate 156 is coupled to the output of sense amplifiers 142, 146 and 150 to determine whether all bits $A_0$–$A_{31}$ of the adder are set to "0".

As can be seen from the foregoing, the use of the sense amplifier 62 to perform complex logical operations will result in a low voltage, high frequency circuit. Since the trip-point of the inverter 78 of the sense amplifier 62 may be set as desired, the limiting factor for low voltage operation is the voltage thresholds of the N-channel transistors implementing the logic function, such that a path to ground may be formed. This will typically not be a factor for a supply voltage in excess of two volts. Because the sense amplifier 142 maintains the IN node 64 just below or just above the trip-point of the inverter 78, switching may be performed at high speeds, despite a low supply voltage. Thus a microprocessor capable or achieving 20 MHz operation at 2.7 volts is possible using the sense amplifiers to implement time critical logic functions.

The foregoing description illustrates several important circuits used in the microprocessor where a high speed circuit is critical. The sense amplifier can be used in other portions of the microprocessor to implement logic functions where high speed operation is a factor. The sense amplifier will generally be used to bit line sensing in ROMs and PLAs.

Although the present invention and its advantages have been described in detail, it should be understood that various changes, substitutions and alterations can be made herein without departing from the spirit and scope of the invention as defined by the appended claims.

What is claimed is:

1. A processor capable of operating at a high clock rate with reduced operating voltage comprising:
    (a) core circuitry that executes instructions;
    (b) bus control circuitry operable to transfer instructions and data between the processor and an external memory;
    (c) memory management circuitry operable to transfer instructions and data between the core circuitry and the external memory;
    (d) clock generation circuitry, coupled to the core circuitry, the memory management circuitry, and the bus control circuitry, for generating at least one clock signal; and
    (e) a plurality of sense amplifiers included in at least one of the core circuitry, the memory management circuitry, the bus control circuitry, and the clock generation circuitry, the plurality of sense amplifiers operable to compress logic thresholds to increase logic switching speed.

2. A processor as recited in claim 1 wherein the core circuitry comprises:
    (a) an instruction queue;
    (b) a decoder coupled to the instruction queue;
    (c) a sequencer coupled to the decoder;
    (d) a microcode ROM coupled to the decoder and to the sequencer;
    (e) an execution unit coupled to the microcode ROM and to the sequencer; and
    (f) a plurality of input/output registers.

3. A processor as recited in claim 1 wherein the processor further comprises:
    (f) an instruction/data cache; and
    (g) the memory management unit being operable to transfer instructions and data among the core circuitry, the external memory, and the instruction/data cache.

4. A processor as recited in claim 1 wherein the clock generation circuitry generates a first and a second clock signal, the first clock signal being coupled to the bus control circuitry and the second clock signal being coupled to the core circuitry and to the memory management circuitry.

5. A processor as recited in claim 4 wherein the second clock signal is disabled during inactive periods of operation for reducing power consumption.

6. A processor as recited in claim 1 wherein each of the plurality of sense amplifiers are selectably enabled by asserting an enable line.

7. A processor as recited in claim 1 wherein the reduced operating voltage is substantially 3.3 volts.

8. A processor as recited in claim 1 wherein the processor operates at a clock rate of at least 20 MHZ at the reduced operating voltage.

9. A processor as recited in claim 1 wherein each of the plurality of sense amplifiers comprises:
   (i) an input node;
   (ii) an output node;
   (iii) an enable node;
   (iv) a first and a second P-channel transistor, each having a first and a second drain/source and a gate;
   (v) a first and a second N-channel transistor, each having a first and a second drain/source and a gate;
   (vi) a first, a second, and a third inverter, each inverter having an input and an output; and
   (vii) the enable node being coupled to the gates of the first P-channel and the first N-channel transistor, the first drain/source of the first P-channel transistor being coupled to a high side of the reduced operating voltage, the second drain/source of the first P-channel transistor being coupled to the first drain/source of the second P-channel transistor and to the first drain/source of the second N-channel transistor, the second drain/source of the second P-channel transistor and the second drain/source of the second N-channel transistor being coupled to a first drain/source of the first N-channel transistor and to the input node, the second drain/source of the first N-channel transistor being coupled to a common side of the reduced operating voltage, the input node being coupled to the input of a first inverter, the output of the first inverter being coupled to the input of the second inverter and to the input of a third inverter and to the gate of the second N-channel transistor, the output of the third inverter being coupled to the gate of the second P-channel transistor, and the output of the second inverter being coupled to the output node.

10. A processing device fabricated with conventional five volt process technology capable of operating at a clock rate of at least 20 MHZ over a range of operating voltages from substantially 2.7 volts to substantially 5.5 volts, the processing device comprising:
   (a) core circuitry that executes instructions;
   (b) bus control circuitry operable to transfer instructions and data between the processor and an external memory;
   (c) memory management circuitry operable to transfer instructions and data between the core circuitry and the external memory;
   (d) clock generation circuitry, coupled to the core circuitry, the memory management circuitry, and the bus control circuitry, for generating at least one clock signal; and
   (e) a plurality of sense amplifiers included in at least one of the core circuitry, the memory management circuitry, the bus control circuitry, and the clock generation circuitry, the plurality of sense amplifiers operable to compress logic thresholds to increase logic switching speed.

11. A processing device as recited in claim 10 wherein a logic state change is sensed at substantially 1 volt for an operating voltage of substantially 2.7 volts.

* * * * *